United States Patent
Yoon et al.

(10) Patent No.: US 6,184,078 B1
(45) Date of Patent: *Feb. 6, 2001

(54) METHOD FOR FABRICATING A CAPACITOR FOR A DYNAMIC RANDOM ACCESS MEMORY CELL

(75) Inventors: Sei-Seung Yoon; Yong-Cheol Bae, both of Seoul (KR)

(73) Assignee: Samsung Electronics., Ltd., Suwon (KR)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/170,086

(22) Filed: Oct. 13, 1998

(30) Foreign Application Priority Data

Oct. 14, 1997 (KR) .................................. 97-52475

(51) Int. Cl.⁷ .................................. H01L 21/8242
(52) U.S. Cl. .................. 438/253; 438/254; 438/396; 438/397
(58) Field of Search .................. 438/250, 253, 438/254, 256, 396, 397, 399

(56) References Cited

U.S. PATENT DOCUMENTS

| | | | |
|---|---|---|---|
| 5,622,889 | 4/1997 | Yoo et al. | 438/397 |
| 5,631,185 * | 5/1997 | Kim et al. | 438/397 |
| 5,786,250 * | 7/1998 | Wu et al. | 438/254 |
| 5,872,041 * | 2/1999 | Lee et al. | 438/397 |
| 5,926,709 * | 7/1999 | Aisou et al. | 438/253 |
| 5,930,623 * | 7/1999 | Wu | 438/253 |
| 6,037,234 * | 7/1999 | Hong et al. | 438/396 |

* cited by examiner

Primary Examiner—Charles Bowers
Assistant Examiner—Jack Chen
(74) Attorney, Agent, or Firm—Jones Volentine, L.L.C.

(57) ABSTRACT

A method for fabricating a DRAM cell capacitor is applicable to a high density dynamic random access memory (DRAM) device on a semiconductor substrate wherein a storage node is formed on a buried contact pad in self-alignment. The method comprises forming a second insulator layer on the first insulator layer including the buried contact pad. An etching stopper layer is next formed on the second insulator layer. Sequentially, a third insulator layer and a first polysilicon layer are formed on the etching stopper layer. A masking layer is formed on the first polysilicon layer to define a storage node. The first polysilicon layer and the third insulator layer are sequentially etched using the masking layer until the etching stopper layer is exposed, so as to form a top via hole. A sidewall spacer is formed on both sidewalls of the top via hole. After removal of the masking layer, the etching stopper layer and the second insulator layer are sequentially etched using a combination of the first polysilicon layer and the sidewall spacer as a mask until the contact pad is exposed, so as to form a bottom via hole beneath the top via hole. A second polysilicon layer is deposited filling up the bottom and top via holes. The semiconductor substrate is planarized by CMP procedure until the third insulator layer is exposed. Finally, the third insulator layer is etched to form the cylindrical storage node having the sidewall spacer and the second polysilicon layer in self-alignment.

16 Claims, 6 Drawing Sheets

METHOD FOR FABRICATING A CAPACITOR FOR A DYNAMIC RANDOM ACCESS MEMORY CELL

FIELD OF THE INVENTION

The present invention relates to a method for fabricating a capacitor for a high density dynamic random access memory (DRAM).

BACKGROUND OF THE INVENTION

With the continuous increase in integration of DRAM devices, respective components, for example, cell capacitors to store data, in each DRAM device are further reduced in each dimension. Nevertheless, the cell capacitors must have a sufficient enough capacitance to store data. Consequently, to increase the capacitance of a capacitor which is formed in a limited area, technological studies have been undertaken to increase the effective area of such capacitors. Most storage nodes of cell capacitors which are formed in high density DRAM devices of 256 Megabits and more have three-dimensional structures such as a cylindrical, cup, crown, or fin-shaped structure.

Several methods to increase capacitance have been published. Of them, particularly, a hemispherical grain silicon (HSG) forming method is disclosed in U.S. Pat. No. 5,622,889. If that method is applied to fabrication of DRAM cell capacitors, the capacitor storage nodes have to be further miniaturized in the limited area because a constant interval between the storage nodes should be maintained. The miniaturization of capacitor storage nodes makes it difficult to provide an overlapping margin (depicted by a symbol "M" in FIG. 1C) between the capacitor storage node and the buried contact pad or the buried contact in fabrication of DRAM devices.

In addition, as the degree of integration in DRAM devices is further increased, size of the capacitor storage node or the buried contact pad for electrical connection with the storage node junction must be further miniaturized. For this reason, it is also very difficult to overlap the capacitor storage node with the capacitor contact pad or the buried contact in fabrication of DRAM devices.

SUMMARY OF THE INVENTION

The present invention is intended to solve the problem, and it is an object of the invention to provide a method for fabricating a DRAM cell capacitor in which a storage node is formed on a buried contact pad in self-alignment.

It is another object of the present invention to provide a method for fabricating a DRAM cell capacitor in which a storage node and a buried contact pad are sufficiently overlapped with each other.

According to one aspect of the present invention, a method for fabricating a capacitor is applicable to a high density dynamic random access memory (DRAM) device on a semiconductor substrate which has a buried contact pad within a first insulator layer formed thereon. This method comprises forming a second insulator layer on the first insulator layer, including on the buried contact pad. A third insulator layer is formed thereon. An etching stopper layer is next formed on the third insulator layer. Sequentially, a fourth insulator layer and a first polysilicon layer are formed on the etching stopper layer. A masking layer is formed on the first polysilicon layer to define a storage node. The first polysilicon layer and the fourth insulator layer are sequentially etched using the masking layer until the etching stopper layer is exposed, so as to form a top via hole. A sidewall spacer is formed on the sidewall of the top via hole. After removing the masking layer, the etching stopper layer and the second and third insulator layers are sequentially etched using a combination of the first polysilicon layer and the sidewall spacer as a mask until the contact pad is exposed, so as to form a bottom via hole beneath the top via hole. A second polysilicon layer is deposited, filling up the bottom and top via holes. The semiconductor substrate is planarized by a chemical mechanical polishing (CMP) procedure until the third insulator layer is exposed. Finally, the third insulator layer is etched to form the storage node wherein the sidewall spacer and the second polysilicon layer are in self-alignment.

According to the other aspect of the present invention, a method for fabricating a capacitor for a high density dynamic random access memory (DRAM) device on a semiconductor substrate having a buried contact pad within a first insulator layer formed thereon, comprises forming a second insulator layer on the first insulator layer, including on the buried contact pad. A third insulator layer is formed thereon. An etching stopper layer is next formed on the third insulator layer. A fourth insulator layer is formed on the etching stopper layer. On the fourth insulator layer, a masking layer is formed to define a storage node. The fourth insulator layer is etched, using the masking layer, until the etching stopper layer is exposed, so as to form a top via hole. After removal of the masking layer, a first polysilicon layer is deposited on the fourth insulator layer filling the top via hole. The first polysilicon layer is etched back in order that a sidewall spacer is formed on the interior sidewall of the top via hole and a part of the first polysilicon layer remains on an upper surface of the third insulator layer. The etching stopper layer and the second and third insulator layers are etched, using a combination of the part and sidewall spacer of the first polysilicon layer as a mask, until the contact pad is exposed, so as to form a bottom via hole beneath the top via hole. A second polysilicon layer is deposited filling up the bottom and top via holes. The semiconductor substrate is planarized until the fourth insulator layer is exposed. The fourth insulator layer is etched to form the storage node, having a cylindrical shape and having the sidewall spacer and the second polysilicon layer in self-alignment.

BRIEF DESCRIPTION OF THE DRAWINGS

This invention may be understood and its objects will become apparent to those skilled in the art by reference to the accompanying drawings as follows.

DETAILED DESCRIPTION OF PREFERRED EMBODIMENTS

The present invention will be described with reference to a preferred embodiment, but it must be recognized that the present invention can be widely modified and varied, and the scope of the present invention is not limited except as set forth in the accompanying claims.

Figure 1A:
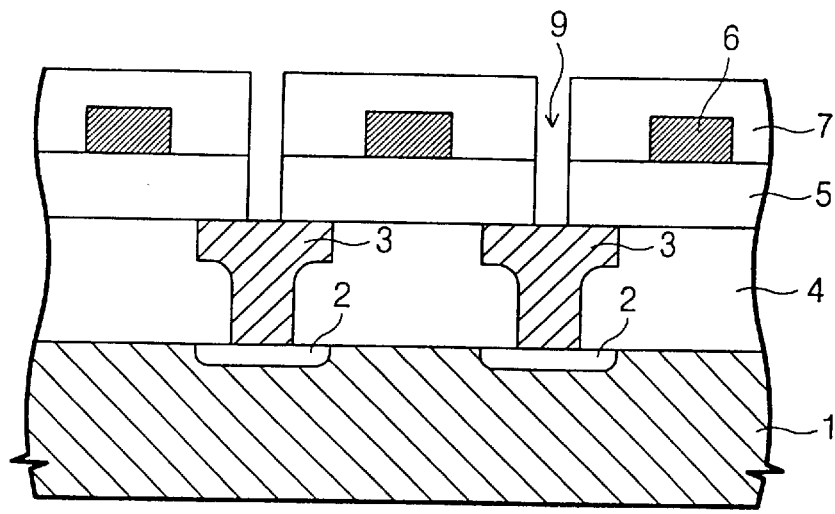
FIGS. 1A to 1C show the process steps of a prior art method for fabricating a DRAM cell capacitor.
Figure 1B:
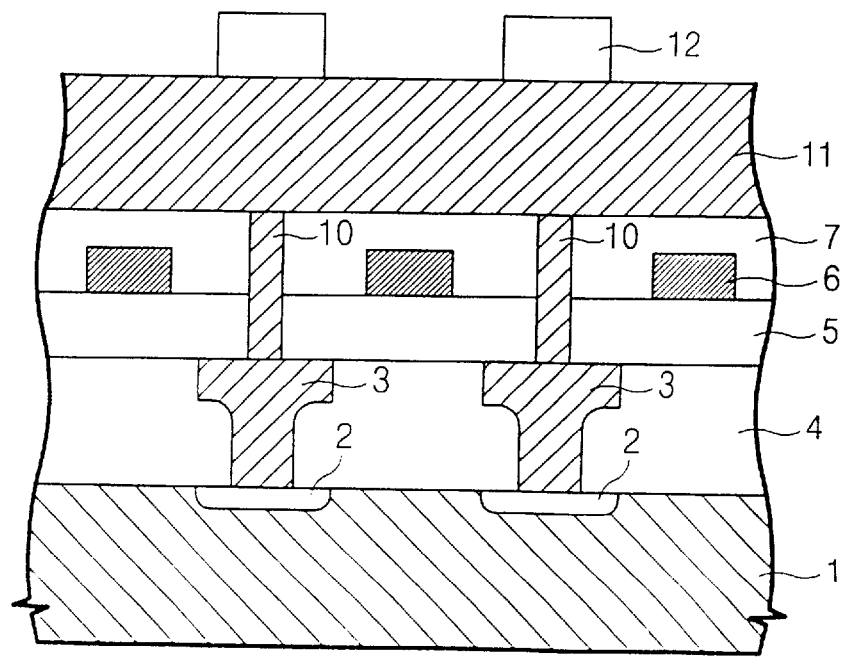
Figure 1C:
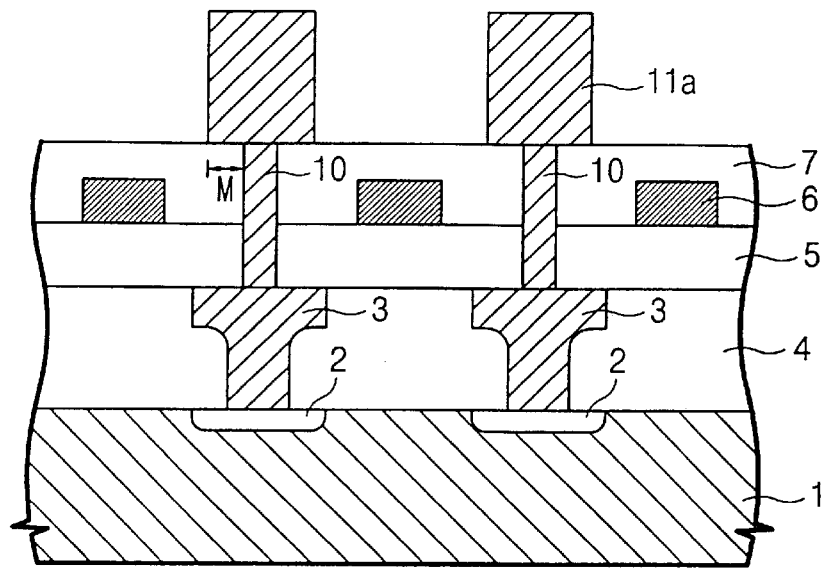

FIGS. 1A to 1C show the process steps of a prior art method for fabricating a DRAM cell capacitor.

FIG. 1A schematically show a substrate prior to formation of a storage node of a DRAM cell capacitor. A storage node junction 2 is formed on a semiconductor substrate 1. A contact pad 3 of, for example, doped polysilicon is formed on the storage node junction 2 through an insulator layer 4 which is deposited on the entire surface of the semiconductor substrate 1. Next, the insulator layer 4 is planarized using chemical mechanical polishing procedures (CMP), and then another insulator layer 5 is deposited over the substrate. A bit line 6 is formed on the insulator layer 5 and another insulator layer 7 is deposited over the substrate including the bit line 6. A via hole 9 is formed through the insulator layers 7 and 5 on the upper surface of the contact pad 3 to form a contact plug therein. Although not shown in FIG. 1A, a circuit component, such as a transfer gate transistor or word line, may be formed on both sides of the contact pad 3, but they are not explained immediately above to omit redundant descriptions.

With reference to FIG. 1B, a layer of polysilicon is filled into the via hole 9 to form a contact plug 9, and then another layer of polysilicon 11 is deposited over the entire surface of the substrate. Doping of the polysilicon layers is achieved via insitu deposition or ion implantation. Next, a photoresist pattern 12 is formed on the polysilicon layer 11 via photolithographic procedures to define a storage node.

FIG. 1C shows the DRAM cell capacitor wherein the storage node 11a is accurately located on the contact plug 10. In FIG. 1C, an etching procedure is performed using the photoresist pattern 12 as a masking layer to form a storage node 11a of cylindrical shape, and then an etching procedure is followed to remove the photoresist pattern. As a result, a DRAM cell capacitor is completely fabricated.

Figure 2A:
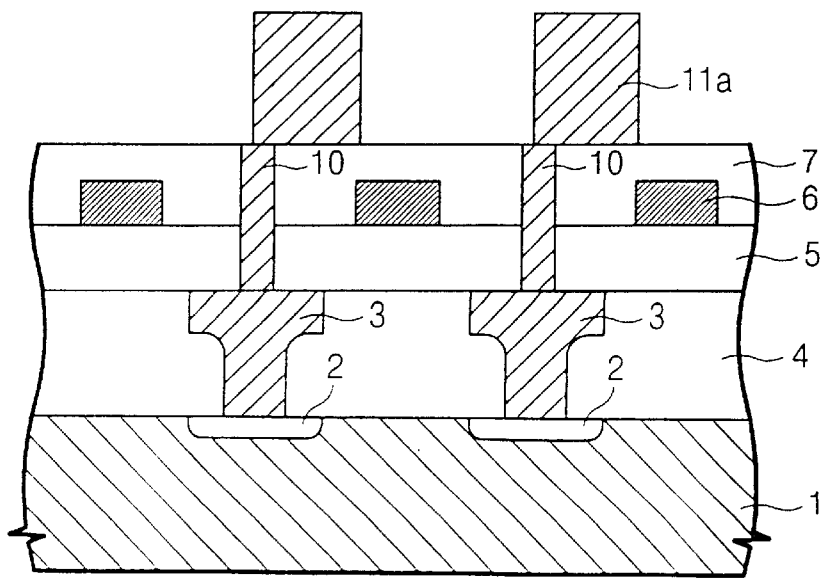
FIGS. 2A and 2B are cross-sectional views for explaining that an undercut is generated between a storage node and a buried contact pad of the DRAM cell capacitor fabricated according to the prior art method.
Figure 2B:
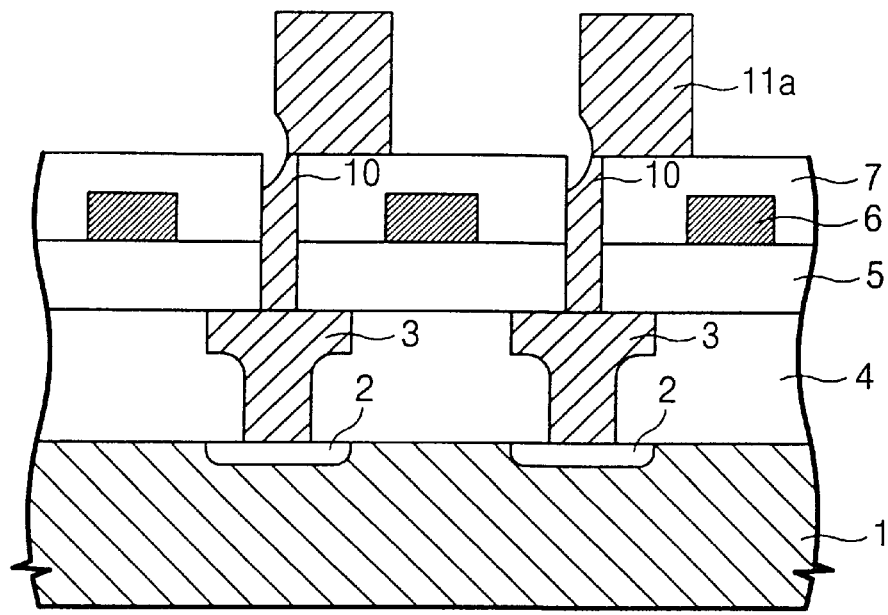

However, after formation of the storage node 11a, a wet cleaning procedure must be performed to completely remove residual of the photoresist pattern, including particles. As shown in FIGS. 2A and 2B, if the storage node 11a is not accurately aligned and overlapped with the contact pad 10, an undercut is generated therebetween during the wet cleaning procedure. The undercut leads to fail of the DRAM device due to a break of the storage node 11a.

FIGS. 3A to 3F show the process steps of a novel method for fabricating a DRAM cell capacitor according to an embodiment of the present invention.

Hereinafter, the novel method will now be described in which a storage node and a buried contact pad in the DRAM cell capacitor are significantly overlapped with each other by self-aligning the storage node with the buried contact pad, regardless of how greatly the storage node is miniaturized. This method will also show how to prevent an undercut from being generated at the storage node during a wet cleaning, compared to counterparts created using the prior art.

Figure 3A:
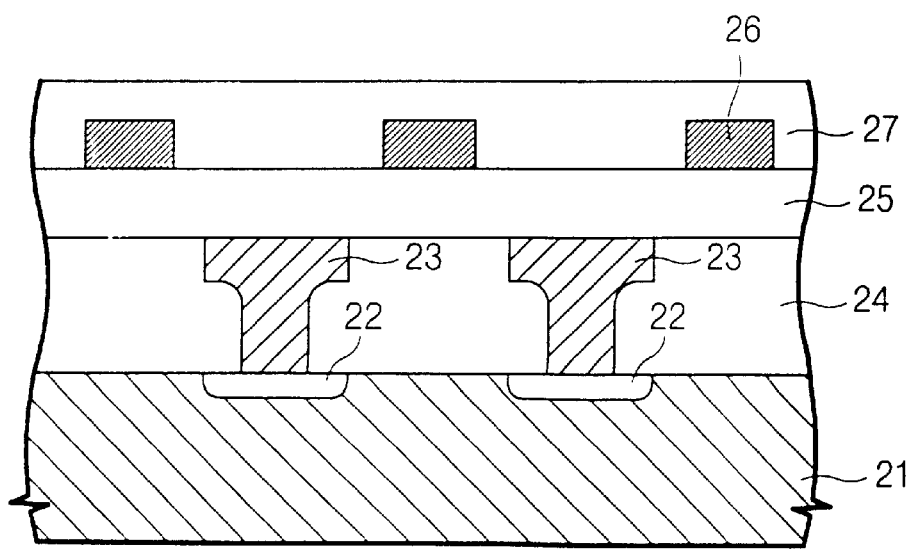
FIGS. 3A to 3F show the process steps of a novel method for fabricating a DRAM cell capacitor according to an embodiment of the present invention.

Referring to FIG. 3A, a storage node junction 22 is formed on a semiconductor substrate 21 via ion injection and diffusion procedures. A contact pad 23 of, for example, doped polysilicon is formed on the storage node junction 22 within an insulator layer 24 which is deposited on the entire surface of the semiconductor substrate 21. Next, the insulator layer 24 is planarized using CMP, and then another insulator layer 25 is deposited on the entire surface of the substrate. A bit line 26 is formed on the insulator layer 25 and another insulator layer 27 is deposited over the substrate, including the bit line 26. Although not shown in FIG. 3A, a circuit component such as a transfer gate transistor or a word line may be formed on both sides of the contact pad 23, but this is not explained immediately above to omit redundant descriptions.

Figure 3B:
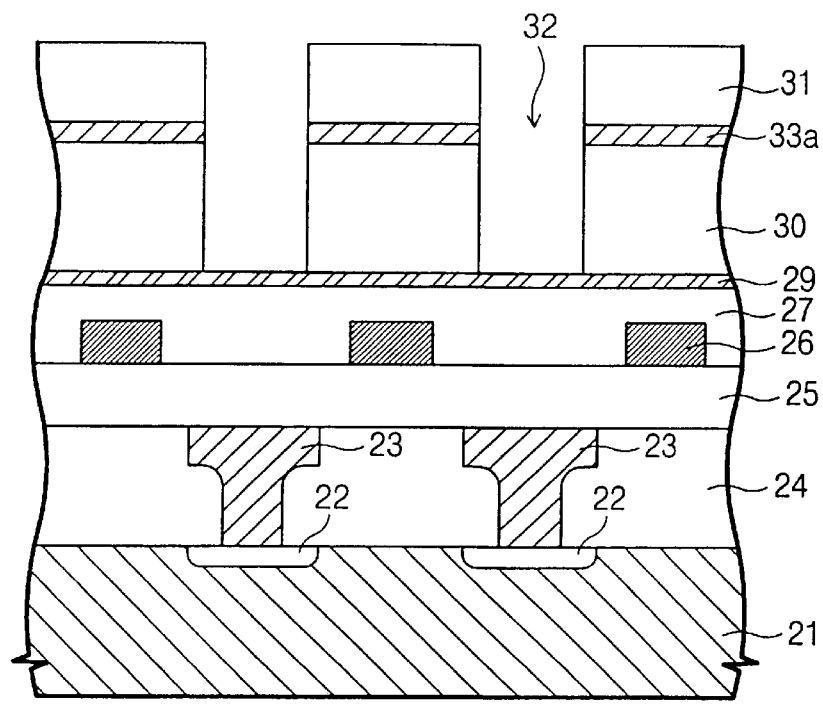

Subsequently, as shown in FIG. 3B, another layer of, for example, silicon nitride (SiN) 29 is deposited using either a low pressure chemical vapor deposition (LPCVD) or a plasma enhanced chemical vapor deposition (PECVD) processing. Another insulator layer of silicon oxide 30 is deposited again using either LPCVD or PECVD processing to a thickness between about 2000 to 20000 Angstroms. Thickness of the silicon oxide layer 30 is important since the storage node thickness will be directly related to the silicon oxide thickness. The silicon oxide layer 30 has a thickness which is the same as or greater than the thickness of the storage. The SiN layer 29 has a thickness sufficient enough to serve as an etching stopper layer during selective etching of the silicon oxide layer 30, but is also relatively thin compared to the silicon oxide layer thickness. Next, a layer of polysilicon 33a and a masking layer of, for example, photoresist 31 are sequentially formed on the silicon oxide layer 30, followed by an anisotropic reactive ion etching (RIE). The anisotropic RIE, using the masking layer 31 as an etching mask, continues to be performed until the etching stopper layer 29 is exposed. As a result, a via hole 32 (hereinafter, referred to as a "top via hole") is formed through the silicon oxide layer 30 as well as the polysilicon layer 33a.

Figure 3C:
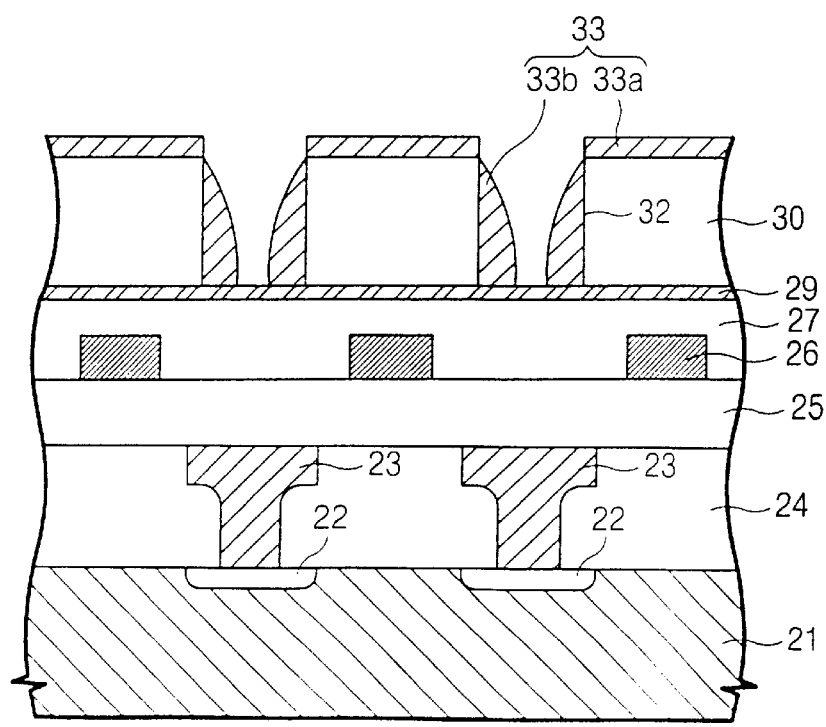

With reference to FIG. 3C, another layer of polysilicon 33b is deposited via LPCVD procedures and doped via conventional ion implantation processes, followed by the anisotropic RIE again. As a result, the polysilicon sidewall spacer 33b is formed on the interior sidewalls of the top via hole 32. Conductivity of the polysilicon layers 33a and 33b may be also achieved via insitu deposition.

In this embodiment of the invention, the polysilicon layer 33a and the masking layer 31 are sequentially formed on the silicon oxide layer 30, followed by the anisotropic RIE needed to form the top via hole 32. In an alternative second embodiment, the masking layer 31 may be formed directly on the silicon oxide layer 30 and a layer of polysilicon 33b is deposited filling into the top via hole 32, followed by the anisotropic RIE. In this case, when the anisotropic RIE is performed to form the polysilicon sidewall spacer 33b on the interior sidewalls of the top via hole 32, process conditions of the RIE procedure can be controlled so that a part of the polysilicon layer remains on the upper surface of the silicon oxide 30.

Figure 3D:
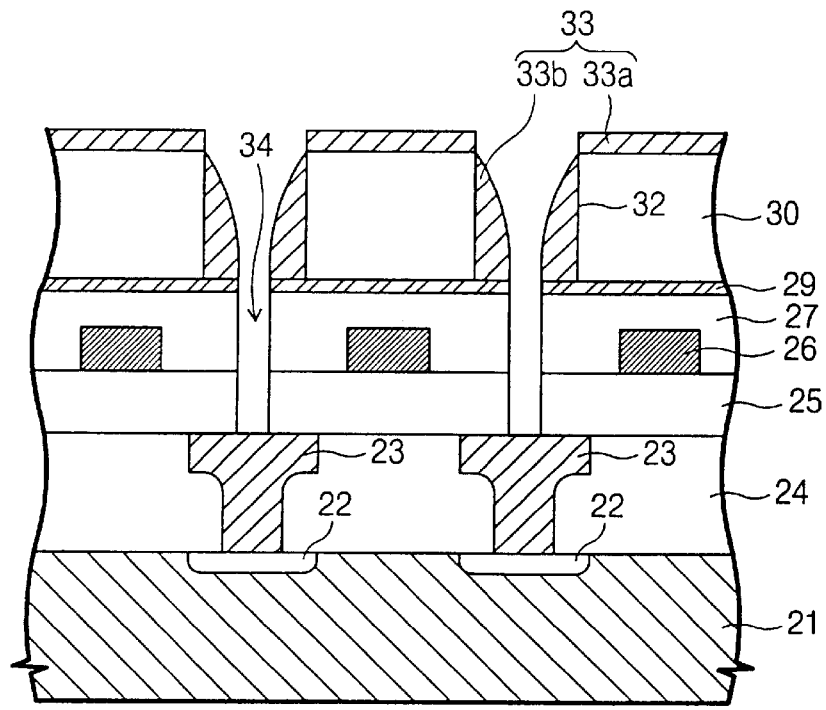

In FIG. 3D, after removal of the masking layer 31, another anisotropic RIE is performed using the polysilicon layers 33a and 33b as an etching mask to sequentially selectively remove the SiN layer 20 and the insulator layers 27, 25. This RIE procedure continues to be performed until the upper surface of the contact pad 23 is exposed. As a result, a via hole 34 (hereinafter, referred to as a "bottom via hole") is formed beneath the top via hole 32.

Figure 3E:
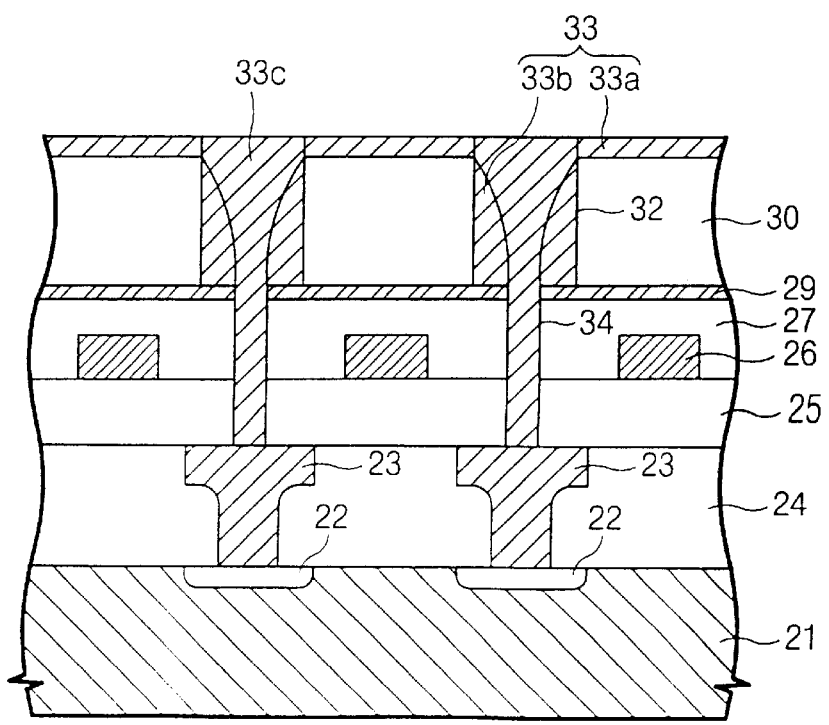

As shown in FIG. 3E, another layer of polysilicon 33c is deposited, filling up the bottom and top via holes 34 and 32 using LPCVD procedures.

Figure 3F:
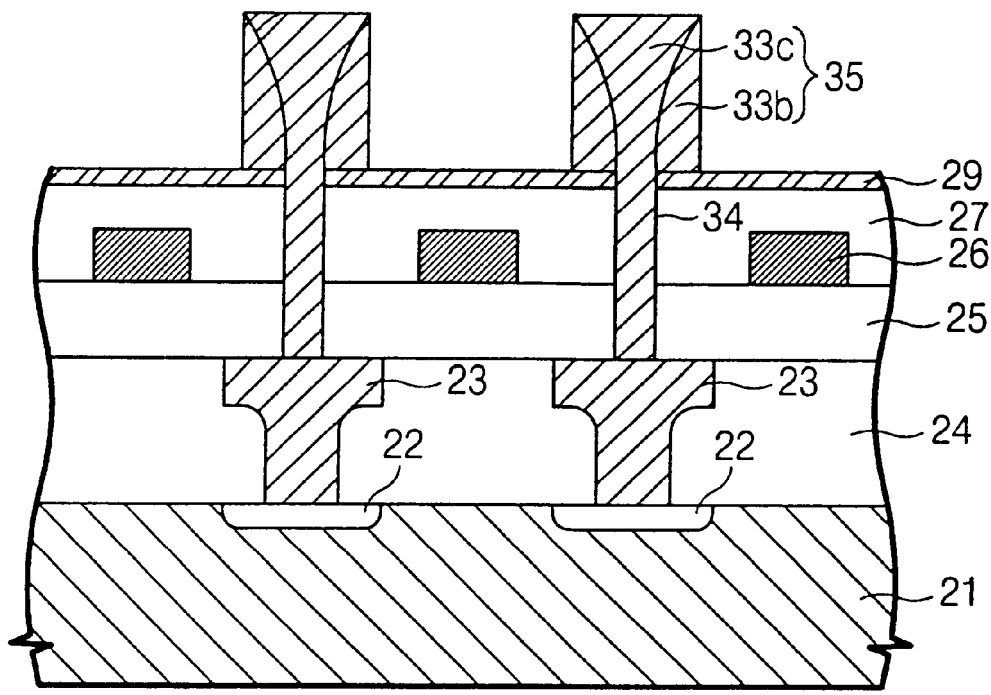

Finally, as shown in FIG. 3F, a CMP procedure is performed on the polysilicon layers until the upper surface of the silicon oxide layer 30 is exposed, and then a wet or dry etching procedure of the silicon oxide layer 30 is performed until the SiN layer 29 is exposed. As a result, a storage node 35 comprised of the polysilicon layers 33b and 33c is fabricated in self-alignment which is used as a bottom electrode of DRAM cell capacitor. In a preferred embodiment, the storage node 35 has the shape of a cylinder.

As described above, since a storage node is formed on a buried contact pad in self-alignment, they can be sufficiently overlapped with each other. Accordingly, although a wet cleaning procedure is carried out after formation of the storage node, no undercut is generated at an interface between the storage node and the buried contact pad. As a consequence, production yield of the DRAM devices can be improved.

What is claimed is:

1. A method for fabricating a capacitor for a high density dynamic random access memory (DRAM) device on a semiconductor substrate having a buried contact pad formed thereon within a first insulator layer, comprising:

forming a second insulator layer on the first insulator layer, including on the buried contact pad;

forming a third insulator layer on the second insulator layer;

forming an etching stopper layer on the third insulator layer;

sequentially forming a fourth insulator layer and a first polysilicon layer on the etching stopper layer;

forming a masking layer on the first polysilicon layer to define a storage node;

sequentially etching the first polysilicon layer and the fourth insulator layer, using the masking layer as a first mask, until the etching stopper layer is exposed, to form a top via hole;

forming a sidewall spacer on an interior sidewall of the top via hole;

removing the masking layer;

etching the etching stopper layer and the second and third insulator layers, using a combination of the first polysilicon layer and the sidewall spacer as a second mask, until the buried contact pad is exposed, to form a bottom via hole beneath the top via hole; depositing a second polysilicon layer to fill the bottom and top via holes;

planarizing the first polysilicon layer until the fourth insulator layer is exposed; and etching the fourth insulator layer to form the storage node of said capacitor.

2. The method according to claim 1, wherein the storage node has a thickness which is the same as or greater than a thickness of the fourth insulator layer.

3. The method according to claim 1, wherein the sidewall spacer comprises polysilicon formed by either insitu deposition or ion implantation.

4. The method according to claim 1, wherein the etching stopper layer comprises silicon nitride.

5. The method according to claim 1, wherein the fourth insulator layer comprises silicon oxide.

6. The method according to claim 1, wherein the storage node has a cylindrical shape.

7. The method of claim 6, wherein the interior sidewall of the top via hole is a contiguous cylindrical sidewall.

8. The method according to claim 1, further comprising forming a bit line over the second insulator layer, before forming the third insulator layer.

9. A method for forming a storage node on a semiconductor substrate, comprising:

forming a first insulating layer over the semiconductor substrate;

forming a contact pad in the first insulating layer;

forming a second insulating layer over the first insulating layer;

forming an etching stopper layer over the second insulating layer;

forming a third insulating layer and a masking layer over the etching stopper layer;

providing a first contact hole by etching a portion of the masking layer and the third insulating layer, until the etching stopper layer is exposed;

providing a sidewall spacer on a sidewall of the first contact hole;

providing a second contact hole by etching the etching stopper layer and the second insulating layer, using a remainder of the masking layer and the sidewall spacer as a mask, until the contact pad is exposed; and forming the storage node that fills in at least the first and second contact holes.

10. The method according to claim 9, wherein the masking layer and the sidewall spacer comprise polysilicon.

11. The method according to claim 9, wherein the forming of the storage node comprises:

forming a conductive layer over the substrate to fill at least the first and second contact holes;

planarizing the substrate until the third insulating layer is exposed; and removing the third insulating layer.

12. The method according to claim 11, wherein the conductive layer comprises polysilicon.

13. A method for forming a storage node on a semiconductor substrate, comprising:

forming a first insulating layer over the semiconductor substrate;

forming a contact pad in the first insulating layer;

forming a second insulating layer over the first insulating layer;

forming a etching stopper layer over the second insulating layer;

forming a third insulating layer over the etching stopper layer;

providing a first contact hole by etching a portion of the third insulating layer until the etching stopper layer is exposed;

providing a masking layer over an upper surface of the third insulating layer and the sidewall of the first contact hole;

providing a second contact hole by etching the etching stopper layer and the second insulating layer, using the masking layer as a mask, until the contact pad is exposed; and forming the storage node, which fills in at least the first and second contact holes.

14. The method according to claim 13, wherein the masking layer comprises polysilicon.

15. The method according to claim 13, wherein the forming of the storage node comprises:

forming a conductive layer over the substrate to fill at least the first and second contact holes;

planarizing the substrate until the third insulating layer is exposed; and removing the third insulating layer.

16. The method according to claim 15, wherein the conductive layer comprises polysilicon.

* * * * *